(12) United States Patent
Spurlin

(10) Patent No.: US 6,441,653 B1
(45) Date of Patent: Aug. 27, 2002

(54) CMOS OUTPUT DRIVER WITH SLEW RATE CONTROL

(75) Inventor: James C. Spurlin, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/789,212

(22) Filed: Feb. 20, 2001

(51) Int. Cl.[7] .................................................. H03K 3/00
(52) U.S. Cl. ........................ 327/108; 327/112; 327/170; 326/87
(58) Field of Search ................................ 327/108, 111, 327/112, 170, 109, 379, 380, 389, 391, 376; 326/23, 24, 26, 27, 82, 83, 86, 87

(56) References Cited

U.S. PATENT DOCUMENTS

| | | | | |
|---|---|---|---|---|
| 4,612,466 A | * | 9/1986 | Stewart ........................ | 326/82 |
| 4,725,747 A | | 2/1988 | Stein et al. .................. | 327/389 |
| 4,818,901 A | * | 4/1989 | Young et al. ................. | 326/87 |
| 4,952,818 A | * | 8/1990 | Erdelyi et al. .............. | 327/108 |
| 5,489,862 A | | 2/1996 | Risinger et al. ............ | 327/108 |
| 5,877,647 A | | 3/1999 | Vajapey et al. ............. | 327/391 |
| 6,087,880 A | * | 6/2000 | Takagi .......................... | 326/83 |
| 6,222,403 B1 | * | 4/2001 | Mitsuda ....................... | 327/170 |
| 6,236,248 B1 | * | 5/2001 | Koga ........................... | 327/112 |

\* cited by examiner

*Primary Examiner*—Terry D. Cunningham
*Assistant Examiner*—Long Nguyen
(74) *Attorney, Agent, or Firm*—William B. Kempler; W. James Brady; Frederick J. Telecky, Jr.

(57) ABSTRACT

A CMOS output driver with a DC feedback circuit architecture that changes the output impedance of the driving transistors as the output voltage transition progresses. The output voltage slew rate is then controlled by limiting the gate voltages (node of Ng and Pg) of the output driver transistors during the transition.

15 Claims, 3 Drawing Sheets

CMOS OUTPUT DRIVER WITH SLEW RATE CONTROL

BACKGROUND OF THE INVENTION

1. Field of the Invention

This invention relates generally to bus driver circuits, and more particularly to a CMOS output driver with slew rate control to ensure good signal integrity in a high-speed printed circuit board (PCB) system by reducing self-induced switching noise, transmission line effects generally attributable to PCB traces, and electromagnetic interference.

2. Description of the Prior Art

In modern high-speed PCB systems, fast bus drivers must have controlled output slew rates to ensure good signal integrity. Controlling the slew rate provides three advantages: 1) The self-induced Ldi/dt switching noise of the IC is reduced, 2) transmission line effects of the printed circuit board traces are reduced, and 3) electromagnetic interference is reduced.

FIG. 1 is a schematic diagram illustrating a simple standard CMOS output driver circuit without slew rate control 100 that is well known to those skilled in the art. The output transistors 102, 104 are designed for high drive current capability and, as such, turn on with very fast slew rates.

Many slew rate control circuits have been proposed and implemented in the art. These well-known slew rate control circuits employ complex architectures such as delay lines, RC time constants, one-shots, multi-segmented output transistors, threshold-critical buffers, bias generators, and the like. One slew rate control circuit is disclosed in U.S. Pat. No. 5,877,647 to Vajapey et al., entitled I CMOS Output Buffer With Slew Rate Control, issued Mar. 2, 1999. The slew rate control circuit disclosed in the '647 patent employs multiple (or segmented) output transistors in which slew rate is controlled by relative sizing of the multiple output transistors. Further the slew rate control circuit disclosed in the '647 patent is controlled by timing the turn-on sequence of multiple output transistors by setting the threshold of feedback NAND or NOR gates. These gates have a large gain and result in an abrupt output impedance change when the threshold is crossed. These feedback NAND and NOR gates also have thresholds that are dependent upon the ratio of Pchannel to Nchannel drive strengths.

In view of the foregoing, a need exists for CMOS output driver with slew rate control that employs a single output transistor rather than multiple or segmented output transistors to control each output signal transition.

SUMMARY OF THE INVENTION

To meet the above and other objectives, the present invention provides an improved CMOS output driver having a DC feedback circuit that changes the output impedance of the driving transistors as the output voltage transition progresses. The output voltage slew rate is then controlled by limiting the gate voltages (node of Ng and Pg) of the output driver transistors during the transition.

In one aspect of the invention, a CMOS output driver with slew rate control employs a single output transistor, rather than multiple output transistors, to control slew rate during an output voltage transition.

In another aspect of the invention, a CMOS output driver with slew rate control employs a source follower feedback scheme to provide a smooth transition on the output transistor gate as the output signal transitions, resulting in low switching noise and reduced EMI.

In yet another aspect of the invention, a CMOS output driver with slew rate control integrates process compensation in gate driver transistors to minimize transmission line reflections and ripple.

In still another aspect of the invention, a CMOS output driver with slew rate control employs a resistor divider using matched resistors to limit and control output transistor gate drive during output signal transitions to reduce self-induced Ldi/dt noise.

BRIEF DESCRIPTION OF THE DRAWINGS

Other aspects and features of the present invention, and many of the attendant advantages of the present invention, will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
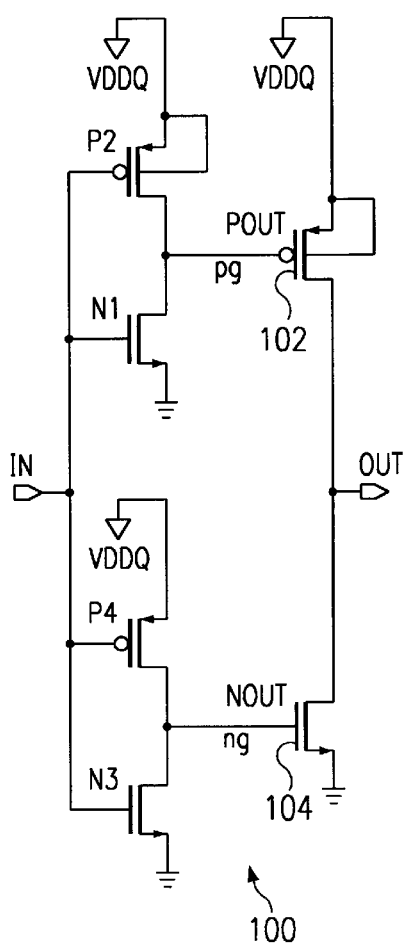
FIG. 1 is a schematic diagram illustrating a conventional CMOS output driver without slew rate control that is known in the prior art.

FIG. 1 is a schematic diagram illustrating a conventional CMOS output driver 100 without slew rate control that is well known in the prior art. The output transistors 102, 104 are designed for high drive current capability and, as such, turn on with very fast slew rates.

Figure 2:
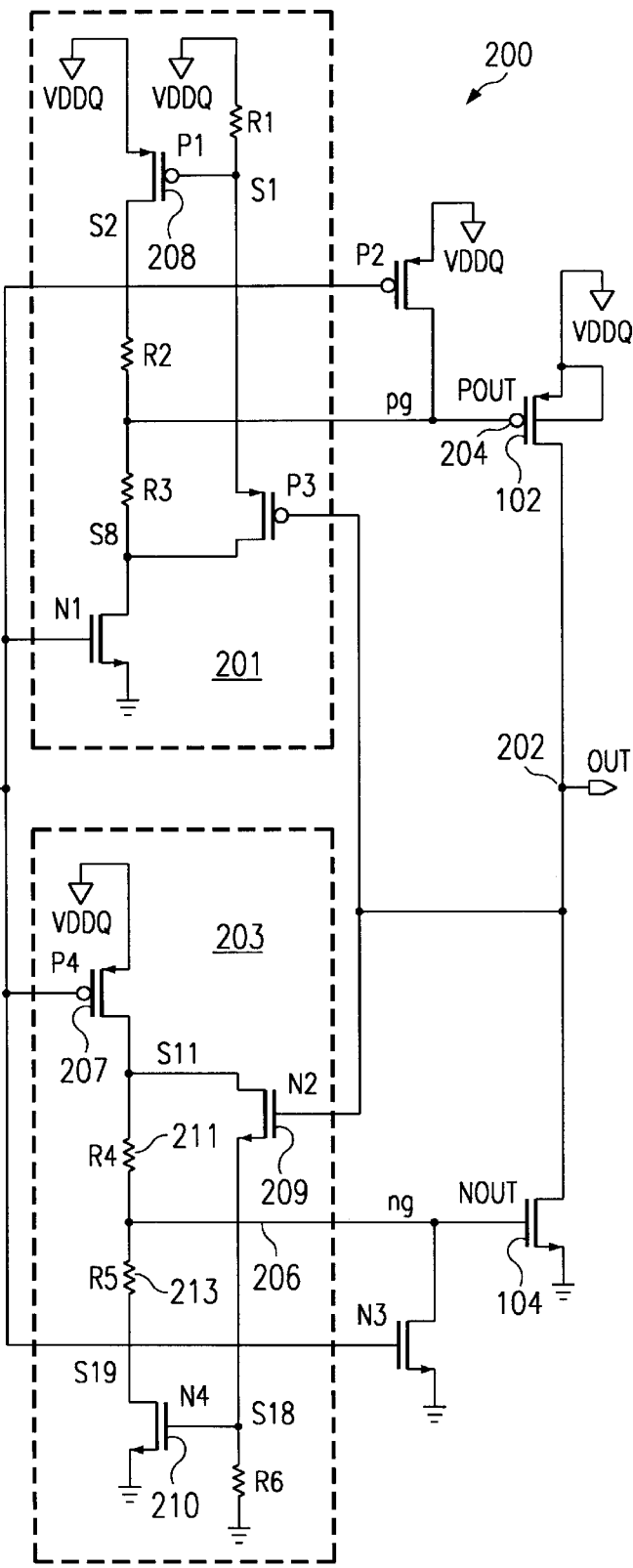
FIG. 2 is a schematic diagram illustrating a CMOS output driver with slew rate control according to one embodiment of the present invention.

FIG. 2 is a schematic diagram illustrating a CMOS output driver 200 with slew rate control according to one embodiment of the present invention. The CMOS output driver 200 advantageously controls the slew rate to reduce self-induced Ldi/dt switching noise, reduce transmission line effects of printed circuit board traces, and reduce electromagnetic interference, as stated herein before. It can be seen that a DC feedback circuit 201, 203 has been added between the common output 202 and the gate node 204, 206 of each respective output transistor 102, 104 to implement the present output driver 200 with slew rate control. Each DC feedback circuit 201, 203 functions to change the output impedance of its respective driving transistor 208, 210 as the output voltage transition at the common output 202 progresses. The output voltage slew rate is then controlled by limiting the gate voltages at the gate nodes 204, 206 of the output driver transistors 102, 104 during the transition.

The falling output voltage transition is controlled by the bottom half of the CMOS output driver circuit 200. Since operation is similar for the rising output voltage transition that is controlled by the top half of the CMOS output driver circuit 200, only the bottom half operation will be described herein to preserve clarity and brevity. With continued reference now to FIG. 2, when the input 212 goes low, it turns on transistor P4 (207). At the same time, since the output 202 is high, transistor N2 (209) acts as a source follower to turn transistor N4 (210) on. This sets up a resistor voltage divider with resistor R4 (211) and resistor R5 (213) to limit the gate 206 voltage of the output transistor 104, which then slows down the initial turn-on of the output transistor 104. The foregoing process therefore reduces the self-induced Ldi/dt noise of an associated IC by limiting the rate of change of switching current through the package parasitic inductances. As the output voltage falls, the resistance of transistor N4 (210) increases, allowing the gate 206 voltage of output transistor 104 to rise. When the output voltage falls below two $V_{tn}$, transistor N4 (210) will cut off completely, allowing full rail voltage to drive the gate 206 of output transistor 104 to provide maximum DC drive capability. The net effect of the foregoing process upon the output voltage waveform is to slow down the slew rate. Transistor N4 (210) further adds some degree of process compensation. Making the output transistor 104 strong, for example, would cause it to switch faster; but since transistor N4 (210) is also strong, transistor N4 (210) reduces the gate 206 voltage of output transistor 104 to compensate. The present inventor found silicide-blocked polysilicon resistors to be most preferable to implement the present CMOS output driver circuit 200 due to their reasonable sheet resistance, low temperature coefficient, and low voltage dependency characteristics.

Figure 3:
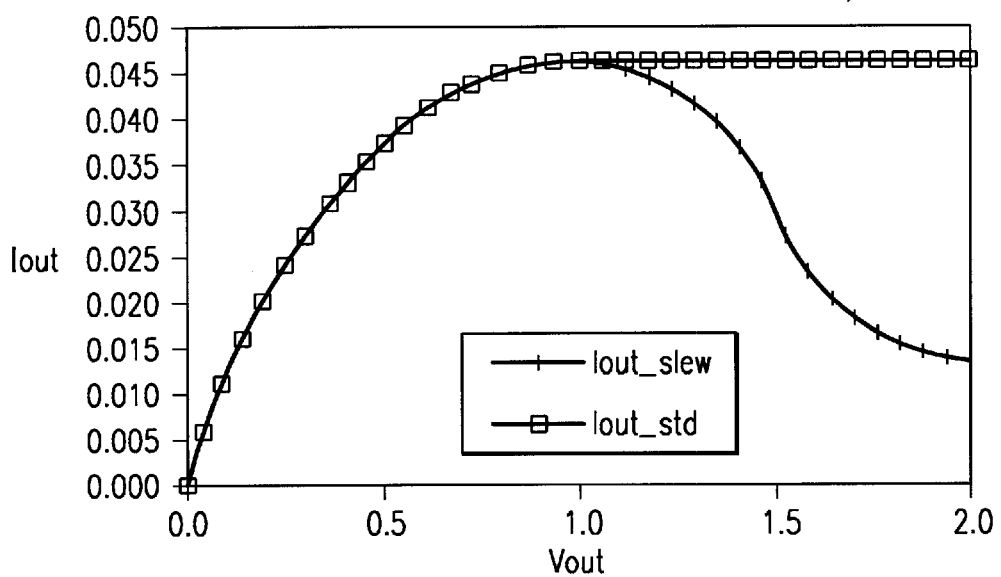
FIG. 3 is a graph that compares the output DC V-I characteristics of the CMOS output driver control circuit shown in FIG. 2 and the CMOS output driver control circuit shown in FIG. 1.

FIG. 3 is a graph 300 that compares the output DC V-I characteristics of the CMOS output driver circuit 200 with slew rate control shown in FIG. 2 and a typical CMOS output driver control circuit 100 shown in FIG. 1. Specifically, the V-I characteristics are compared for the LOW state, i.e., when the lower output transistor 104 is turned ON. At high voltage, i.e., greater than 1.1 volts, the standard driver output is saturated (constant current mode). When the output voltage starts a high-to-low transition, the current will quickly increase to that saturation value, resulting in large Ldi/dt noise. With slew rate control however, the current increases to a lower level, reducing the Ldi/dt noise. As the output voltage falls, i.e., below 1.1 volts, the drive current of CMOS output driver circuit 200 can be seen to approach that of a standard driver 100, providing full DC drive capability.

Figure 4:
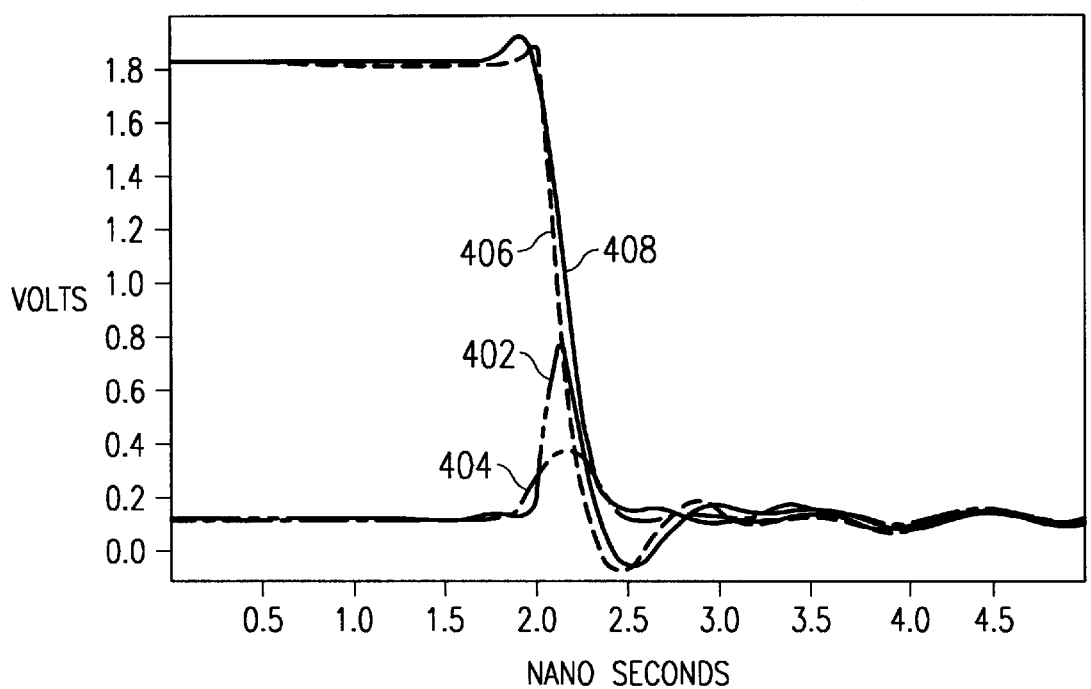
FIG. 4 is a graph that compares switching noise characteristics of the CMOS output driver control circuit shown in FIG. 2 and the CMOS output driver control circuit shown in FIG. 1.

FIG. 4 is a graph 400 that compares switching noise characteristics (out_slew vs. out_std) of the CMOS output driver circuit 200 with slew rate control shown in FIG. 2 and a standard CMOS output driver control circuit 100 shown in FIG. 1. Specifically, a logic device driving a lumped load and having 27 switching outputs and a single quiescent output was implemented using each driver 100, 200. The standard CMOS output driver circuit 100 produced 770 mV of switching noise on the quiescent output as seen from waveform 402, while the CMOS output driver circuit 200 produced only 300 mV, as seen from waveform 404. Further, the output slew rate was reduced from 10.7V/ns for the standard CMOS output driver circuit 100 to only 3.2V/ns for the CMOS output driver circuit 200, as seen from waveforms 406 and 408 respectively.

Figure 5:
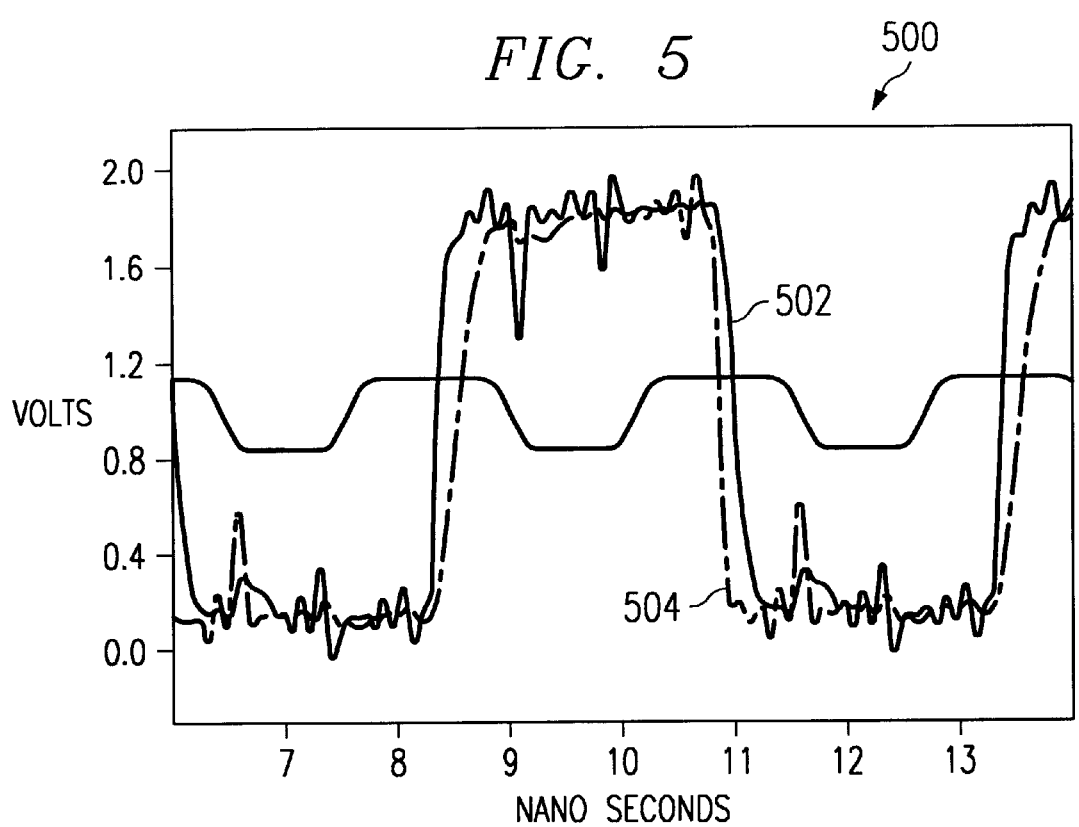
FIG. 5 is a graph that compares transmission line reflection and ringing characteristics at the front end (driver output) of a 50 Ohm transmission line that is 2-inches long and terminated by 50 Ohms and 3 pF for the CMOS output driver control circuit shown in FIG. 2 and the CMOS output driver control circuit shown in FIG. 1.

FIG. 5 is a graph 500 that compares transmission line reflection and ringing characteristics (Out_Std vs. Out_Slew) at the front end (driver output) of a 50 Ohm transmission line that is 2-inches long and terminated by 50 Ohms and 3 pF for the CMOS output driver circuit 200 with slew rate control shown in FIG. 2 and the standard CMOS output driver control circuit 100 shown in FIG. 1. The Out_Slew waveform 502 was generated by the CMOS output driver circuit 200 while the Out_Std waveform 504 was generated by the standard CMOS output driver circuit 100. It can be seen that transmission line reflections and ringing are suppressed at the front end of the transmission line to a greater extent with the CMOS output driver circuit 200.

Figure 6:
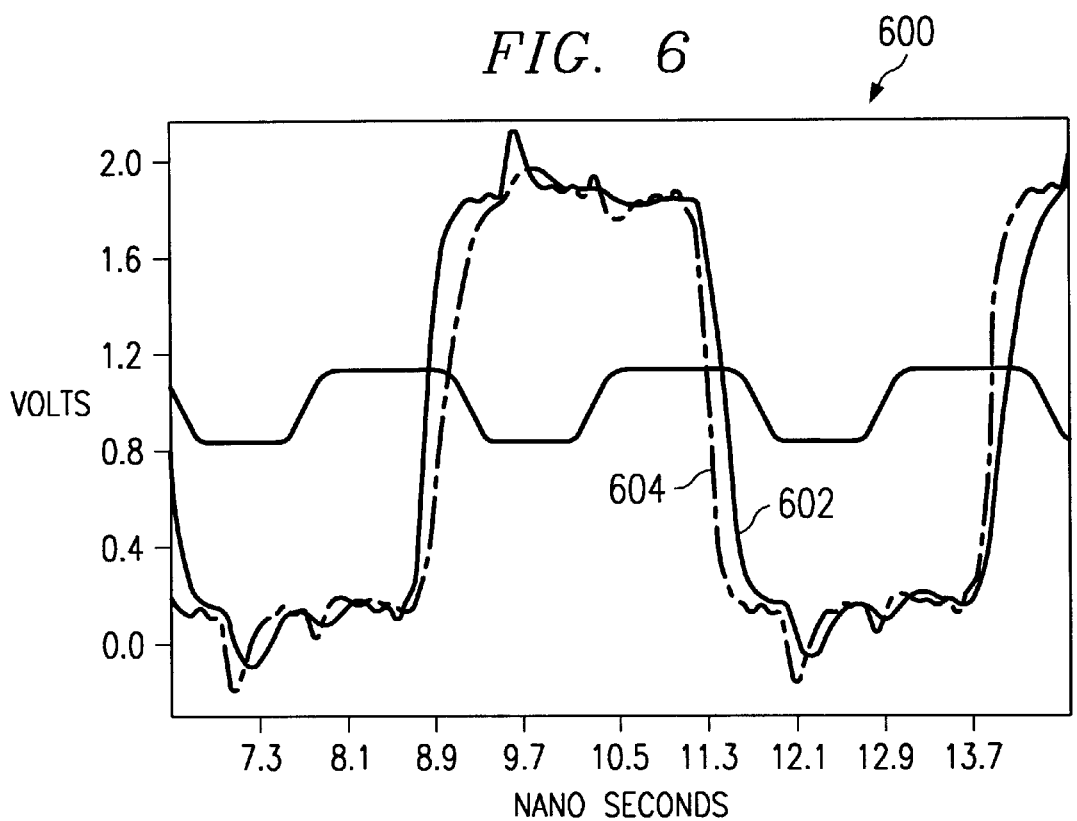
FIG. 6 is a graph that compares transmission line reflection and ringing characteristics at the end (receiver input) of a 50 Ohm transmission line that is 2-inches long and terminated by 50 Ohms and 3 pF for the CMOS output driver control circuit shown in FIG. 2 and the CMOS output driver control circuit shown in FIG. 1.

FIG. 6 is a graph 600 that compares transmission line reflection and ringing characteristics (Out_Std vs. Out_Slew) at the end (receiver input) of a 50 Ohm transmission line that is 2-inches long and terminated by 50 Ohms and 3 pF for the CMOS output driver circuit 200 with slew rate control shown in FIG. 2 and the standard CMOS output driver control circuit 100 shown in FIG. 1. Again, the Out_Slew waveform 602 was generated by the CMOS output driver circuit 200 while the Out_Std waveform 604 was generated by the standard CMOS output driver circuit 100. The results are similar in that the transmission line reflections and ringing are suppressed at the receiver end of the transmission line to a greater extent with the CMOS output driver circuit 200.

In summary explanation, a CMOS output driver circuit 200 employs a simple DC feedback scheme, rather than a more well-known complex scheme such as use of delay lines, RC time constants, one-shots, multi-segmented output transistors, threshold-critical buffers, bias generators, and the like, to provide effective slew rate control using standard output transistor geometries and processes. The DC feedback scheme changes the output impedance of the driving transistors 208, 210 as the output voltage transition progresses such that the output voltage slew rate is controlled by limiting the gate voltages of the output driver transistors 102, 104 during the transition.

In view of the above, it can be seen the present invention presents a significant advancement in the art of CMOS output driver circuit technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve an output driver with slew rate control according to the inventive principles set forth herein above.

What is claimed is:

1. A CMOS output driver circuit comprising:

a single pull up output transistor connected between a first supply terminal and an output terminal, the pull up output transistor having a control terminal;

a single pull down output transistor connected between a second supply terminal and the output terminal, the pull down output transistor having a control terminal; and an input terminal for receiving an input signal and connected to a pull up slew rate control circuit and to a pull down slew rate control circuit;

the pull up slew rate control circuit forming a DC feedback path between the output terminal and the pull up output transistor control terminal and operative to generate and provide a variable control voltage to the pull up output transistor control terminal;

the pull down slew rate control circuit forming a DC feedback path between the output terminal and the pull down output transistor control terminal and operative to generate and provide a variable control voltage to the pull down output transistor control terminal, wherein the pull up slew rate control circuit comprises a CMOS transistor and a resistor voltage divider, the CMOS transistor responsive to changes in output terminal voltage such that its resistance changes to vary a resistance ratio associated with the resistor voltage divider and such that the variable control voltage to the pull up output transistor control terminal changes with the changes in the resistance ratio.

2. The CMOS output driver circuit according to claim 1 wherein the resistance of the CMOS transistor is configured to increase in response to increases in the output terminal voltage.

3. A CMOS output driver circuit comprising:

a single pull up output transistor connected between a first supply terminal and an output terminal, the pull up output transistor having a control terminal;

a single pull down output transistor connected between a second supply terminal and the output terminal, the pull down output transistor having a control terminal; and an input terminal for receiving an input signal and connected to a pull up slew rate control circuit and to a pull down slew rate control circuit;

the pull up slew rate control circuit forming a DC feedback path between the output terminal and the pull up output transistor control terminal and operative to generate and provide a variable control voltage to the pull up output transistor control terminal;

the pull down slew rate control circuit forming a DC feedback path between the output terminal and the pull down output transistor control terminal and operative to generate and provide a variable control voltage to the pull down output transistor control terminal, wherein the pull down slew rate control circuit comprises a CMOS transistor and a resistor voltage divider, the CMOS transistor responsive to changes in output terminal voltage such that its resistance changes to vary a resistance ratio associated with the resistor voltage divider and such that the variable control voltage to the pull down output transistor control terminal changes with the changes in the resistance ratio.

4. The CMOS output driver circuit according to claim 3 wherein the resistance of the CMOS transistor is configured to increase in response to decreases in the output terminal voltage.

5. An output driver circuit comprising:

a single pull up output transistor connected between a first supply terminal and an output terminal, the pull up output transistor having a control terminal;

a single pull down output transistor connected between a second supply terminal and the output terminal, the pull down output transistor having a control terminal;

an input terminal for receiving an input signal;

a pull up slew rate control circuit responsive to an input signal to process a signal generated at the output terminal and generate a pull up output transistor control terminal signal therefrom; and a pull down slew rate control circuit responsive to the input signal to process a signal generated at the output terminal and generate a pull down output transistor control terminal signal therefrom, wherein the pull up slew rate control circuit comprises a CMOS transistor and a resistor voltage divider, the CMOS transistor responsive to changes in output terminal voltage such that its resistance changes to vary a resistance ratio associated with the resistor voltage divider and such that the control signal to the pull up output transistor control terminal changes with the changes in the resistance ratio.

6. The output driver circuit according to claim 5 wherein the resistance of the CMOS transistor is configured to increase in response to increase in the output terminal voltage.

7. An output driver circuit comprising:

a single pull up output transistor connected between a first supply terminal and an output terminal, the pull up output transistor having a control terminal;

a single pull down output transistor connected between a second supply terminal and the output terminal, the pull down output transistor having a control terminal;

an input terminal for receiving an input signal;

a pull up slew rate control circuit responsive to an input signal to process a signal generated at the output terminal and generate a pull up output transistor control terminal signal therefrom; and a pull down slew rate control circuit responsive to the input signal to process a signal generated at the output terminal and generate a pull down output transistor control terminal signal therefrom, wherein the pull down slew rate control circuit comprises a CMOS transistor and a resistor voltage divider, the CMOS transistor responsive to changes in output terminal voltage such that its resistance changes to vary a resistance ratio associated with the resistor voltage divider and such that the control signal to the pull up output transistor control terminal changes with the changes in the resistance ratio.

8. The output driver circuit according to claim 7 wherein the resistance of the CMOS transistor is configured to increase in response to decreases in the output terminal voltage.

9. A CMOS output driver circuit comprising:

a single pull up output transistor connected between a first supply terminal and an output terminal, the pull up output transistor having a control terminal;

a single pull down output transistor connected between a second supply terminal and the output terminal, the pull down output transistor having a control terminal; and an input terminal for receiving an input signal and connected to a means for generating and providing a variable control voltage to the pull up output transistor control terminal and further connected to a means for generating and providing a variable control voltage to the pull down output transistor control terminal;

the means for generating and providing a variable control voltage to the pull up output transistor control terminal being responsive to a first transition of the input signal such that pull up output transistor turn-on time decreases with increases in output signal level at the output terminal;

the means for generating and providing a variable control voltage to the pull down output transistor control terminal being responsive to a second transition of the input signal such that pull down output transistor turn-on time decreases with decreases in output signal level at the output terminal, wherein the means for generating and providing a variable control voltage to the pull up output transistor control terminal comprises a pull up slew rate control circuit including a CMOS transistor and a resistor voltage divider, the CMOS transistor responsive to changes in output terminal voltage such that CMOS transistor resistance changes to vary a resistance ratio associated with the resistor voltage divider and such that the control voltage to the pull up output transistor control terminal changes with the changes in the resistance ratio.

10. The CMOS output driver circuit according to claim 9 wherein the resistance of the CMOS transistor is configured to increase in response to increases in the output terminal voltage.

11. A CMOS output driver circuit comprising:

a single pull up output transistor connected between a first supply terminal and an output terminal, the pull up output transistor having a control terminal;

a single pull down output transistor connected between a second supply terminal and the output terminal, the pull down output transistor having a control terminal; and an input terminal for receiving an input signal and connected to a means for generating and providing a variable control voltage to the pull up output transistor control terminal and further connected to a means for generating and providing a variable control voltage to the pull down output transistor control terminal;

the means for generating and providing a variable control voltage to the pull up output transistor control terminal being responsive to a first transition of the input signal such that pull up output transistor turn-on time decreases with increases in output signal level at the output terminal;

the means for generating and providing a variable control voltage to the pull down output transistor control terminal being responsive to a second transition of the input signal such that pull down output transistor turn-on time decreases with decreases in output signal level at the output terminal, wherein the means for generating and providing a variable control voltage to the pull down output transistor control terminal comprises a pull down slew rate control circuit including a CMOS transistor and a resistor voltage divider, the CMOS transistor responsive to changes in output terminal voltage such that CMOS transistor resistance changes to vary a resistance ratio associated with the resistor voltage divider and such that the control voltage to the pull up output transistor control terminal changes with the changes in resistance ratio.

12. The CMOS output driver circuit according to claim 11 wherein the resistance of the CMOS transistor is configured to increase in response to decreases in the output terminal voltage.

13. An output driver circuit comprising:

a pull-up output transistor connected between a first supply terminal and an output terminal, the pull-up output transistor having a control terminal;

a pull-down transistor connected between a second supply terminal and the output terminal, the pull-down transistor having a control terminal a pull-up slew rate control circuit responsive to an input signal to process a signal generated at the output terminal and generate a pull-up output transistor control terminal signal therefrom; and a pull-down slew rate control circuit responsive to the input signal to process a signal generated at the output terminal and generate a pull-down output transistor control terminal signal therefrom, wherein each slew rate control circuit comprises at least one transistor and a resistor voltage divider such that each slew rate control circuit transistor is responsive to changes in output terminal voltage such that its respective resistance changes to vary a resistance ratio associated with its associated resistor voltage divider, and such that each respective control terminal signal changes with the changes in the associated resistance ratio.

14. The output driver circuit according to claim 13 wherein the resistance of at least one slew rate control circuit transistor is configured to increase in response to increases in the output terminal voltage.

15. The output driver circuit according to claim 13 wherein the resistance of at least one slew rate control circuit transistor is configured to increase in response to decreases in the output terminal voltage.

* * * * *